United States Patent [19]

Nijman

[11] 4,083,022

[45] Apr. 4, 1978

[54] PLANAR PI MULTI-FILTER HAVING A FERRITE INDUCTANCE FOR PIN FILTERS IN ELECTRICAL CONNECTORS

[75] Inventor: John Peter Nijman, West Hill, Canada

[73] Assignee: Bunker Ramo Corporation, Oak Brook, Ill.

[21] Appl. No.: 731,125

[22] Filed: Oct. 12, 1976

[51] Int. Cl.[2] .......................... H03H 7/04; H03H 13/00; H01R 17/10; H01R 13/66

[52] U.S. Cl. .......................... 333/79; 333/70 S; 339/147 R

[58] Field of Search .......................... 333/79, 70 R, 70 S, 333/76, 29, 73 C, 73 R; 361/301-303, 306, 309, 313, 328-330; 339/143 R, 147 R, 147 C, 147 P; 336/105, 107

[56] References Cited

U.S. PATENT DOCUMENTS 3,548,347 12/1970 Miller et al. .......................... 333/70 R
3,638,147 1/1972 Denes .......................... 333/79

*Primary Examiner*—Alfred E. Smith
*Assistant Examiner*—Marvin Nussbaum
*Attorney, Agent, or Firm*—F. M. Arbuckle; W. Lohff

[57] ABSTRACT

A pi pin filter employs a tubular ferrite which receives a pin contact therein. The ferrite tube is metalized over at least a portion of its inner surface, at least two portions of its outer surface, and about its ends and receives the pin contact therein for electrical connection to the metalization by means of a spring contact, solder bonding or fusing. A plurality of dielectric layers extend radially of the ferrite tube and are bonded together to form an integral structure having metal capacitor plates between the layers. Some of the capacitor plates are interconnected, by a metalization to form the ground plates for connection to the metal shell of an electrical connector, while others of the metal plates located intermediate the first-mentioned metal plates are interconnected in two separate groups by a separate metalizations which, upon assembly, are fused to the respective metalized areas on the outer surface of the ferrite tube. A gap in the metalization between the two areas of the outer surface of the ferrite tube, together with the common connection of the first-mentioned plates provides a pair of capacitances and the ferrite tube constitutes an inductance connected between the two capacitances to form a pi filter.

14 Claims, 10 Drawing Figures

10
18
20
34
36
38
23
22
24
73
69
30
32
31
29
26
28
71
16
16
12
14

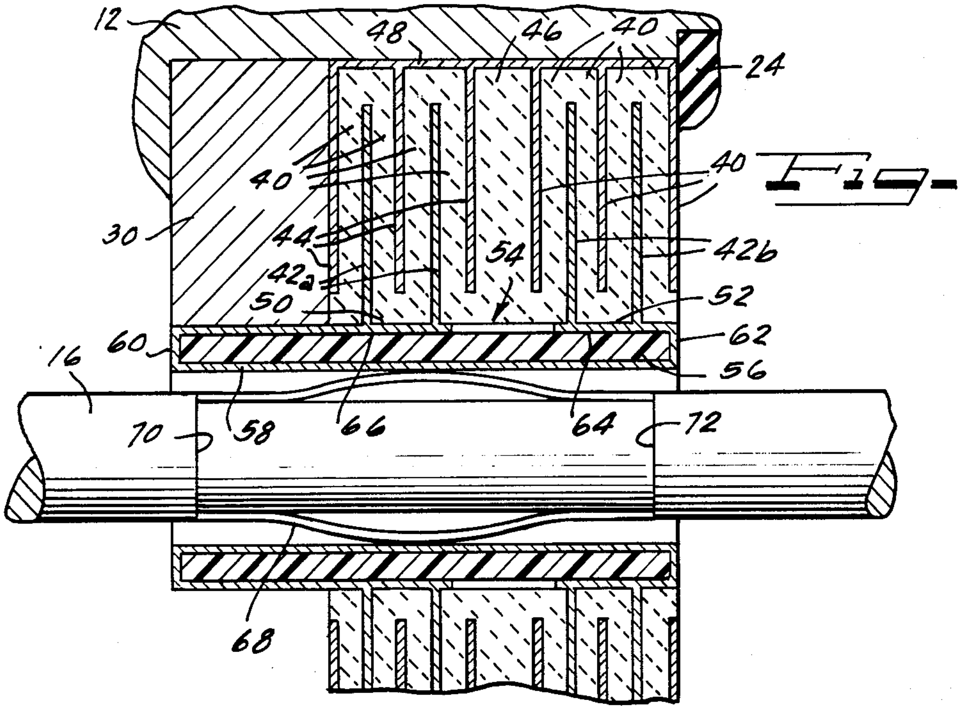
Fig. 2
Fig. 3
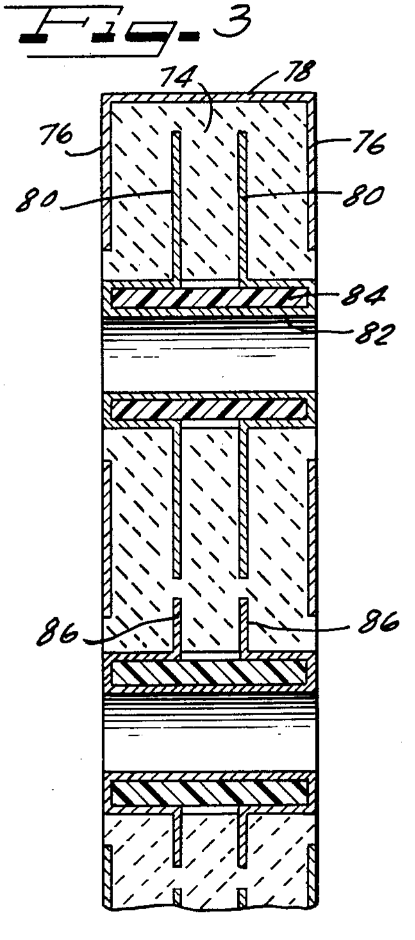
Fig. 4
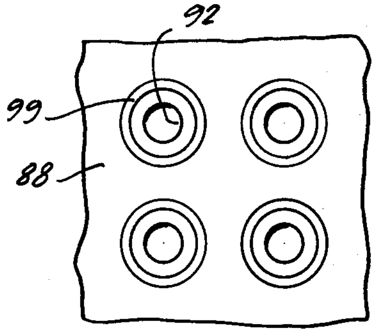
Fig. 5
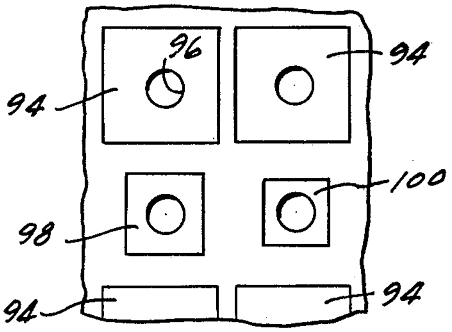

PLANAR PI MULTI-FILTER HAVING A FERRITE INDUCTANCE FOR PIN FILTERS IN ELECTRICAL CONNECTORS

BACKGROUND OF THE INVENTION

1. Field of the Invention

This invention relates to filter structures for filter pin electrical connectors, and is more particularly concerned with pi filters for filter pin application.

2. Description of the Prior Art

The prior art recognizes several approaches to the provision of pi filters for filter pin applications. Generally speaking, the pi filters have heretofore taken up too much space and were expensive. As an example, it is common in the art to provide a two unit multicapacitor with a ferrite insert and to connect the structure between the pin contact and the metal shell of an electrical connector. This requires two contacts to the capacitor terminations in two locations, one for each capacitor.

In my application for U.S. Letters Patent, Ser. No. 539,289, now allowed, and subsequently abandoned, I disclose a connector filter assembly which utilizes a planar capacitor in which the ground plates are connected in common to the metal shell of the connector and a single contact is necessary to connect the other capacitor plates to the pin contact. This structure is simple, reliable, easily prefabricated, and reduces and simplifies handling requirements since only one capacitor assembly is necessary for a connector and, moreover, precision fitting is not necessary and a minimum of axial space is required within the connector.

SUMMARY OF THE INVENTION

The primary object of the present invention is to provide a pi filter for use in electrical connectors as pin contact filters.

A more specific object of the invention is to provide a pi filter of simple structure, which is easily constructed, requires a minimum of handling in the overall assembly procedure, and which can be economically produced.

According to the invention, the pi filter comprises a pair of capacitances which are somewhat similar in nature to the capacitances disclosed in my aforementioned application Ser. No. 539,289. The two capacitances have their ground electrodes connected in common and to the metal shell of the electrical connector, while their other electrodes, hereinafter called positive electrodes, are connected in two groups, with each group connected to opposite areas of a ferrite tube. The ferrite tube receives a pin contact therein and carries a metalization at least partially on its inner surface and over two spaced areas of its outer surface by which the two groups of positive electrodes are connected to the pin contact.

An electrical connector assembly constructed in accordance with the present invention comprises a metal connector shell which carries a dielectric member therein. The dielectric member includes a contact passageway therethrough for receiving and mounting a pin contact. A hollow tubular inductance, in the form of a ferrite tube, is provided for receiving the pin contact therethrough. The ferrite tube has an inner electrical contact area on the inner surface which is electrically connected to the pin contact, by a spring contact, by soldering, fusing or the like, and at least one outer contact area on the outer surface which is electrically connected to the inner electrical contact area. The inner and outer electrical contacts area are advantageously constituted by a metalization carried by the ferrite tube. A plurality of planar capacitor ground plates are spaced apart and connected in common to the metal connector shell, while another plurality of capacitor plates, the positive plates, extend between and spaced from ground plates and are electrically connected to the metalization over the outer contact area of the ferrite tube.

More specifically, an electrical connector assembly constructed in accordance with the present invention comprises a metal connector shell and a dielectric mounted within the shell. The dielectric is commonly termed a dielectric insert and includes a plurality of passageways therethrough which extend spaced apart parallel to the longitudinal axis of the connector assembly. A plurality of elongate pin contacts extend through respective ones of the contact passageways and are received in respective ferrite tubes. The ferrite tubes each include spaced ends, an inner surface and an outer surface and each carries at least one metallic layer which extends over spaced areas of the outer surface, over the ends and over at least spaced areas of the inner surface. The metallic layer is electrically connected to the respective pin contact either at the ends of the ferrite tube or by means of a spring contact carried by the pin contact. Each pin contact and its associated ferrite tube is provided with a pair of capacitors. The ground electrodes of both of the capacitors are connected in common and further connected to the metal connector shell. The positive electrodes of one capacitor of the pair of capacitors are connected together and connected to the metallic layer carried over one area of the outer surface of the ferrite tube. Similarly, the positive electrodes of the other capacitor of this pair of capacitors are connected in common to the metallic layer over the other area of the outer surface of the ferrite tube. Thus, the two capacitors and the ferrite tube constitute a pi filter for the pin contact which extends through the tube.

Advantageously, the metallic layers which constitute the plates of the capacitors may have different plate areas and thus provide different capacitances, and thus different filter characteristics, for the respective pin contacts.

BRIEF DESCRIPTION OF THE DRAWINGS

Other objects, features and advantages of the invention, its organization, construction and operation will be best understood from the following detailed description taken in conjunction with the accompanying drawings, on which:

FIG. 2 is a greatly enlarged sectional view of a pi filter constructed in accordance with the present invention;

FIG. 3 is a schematic illustration of two pi filters having different filtering characteristics due to different sizes of capacitor plates;

FIG. 4 schematically illustrates a typical ground electrode pattern which may be utilized in practicing the present invention;

FIG. 5 schematically illustrates a typical pin or positive electrode pattern which may be utilized in practicing the present invention;

DESCRIPTION OF THE PREFERRED EMBODIMENTS

Figure 1:
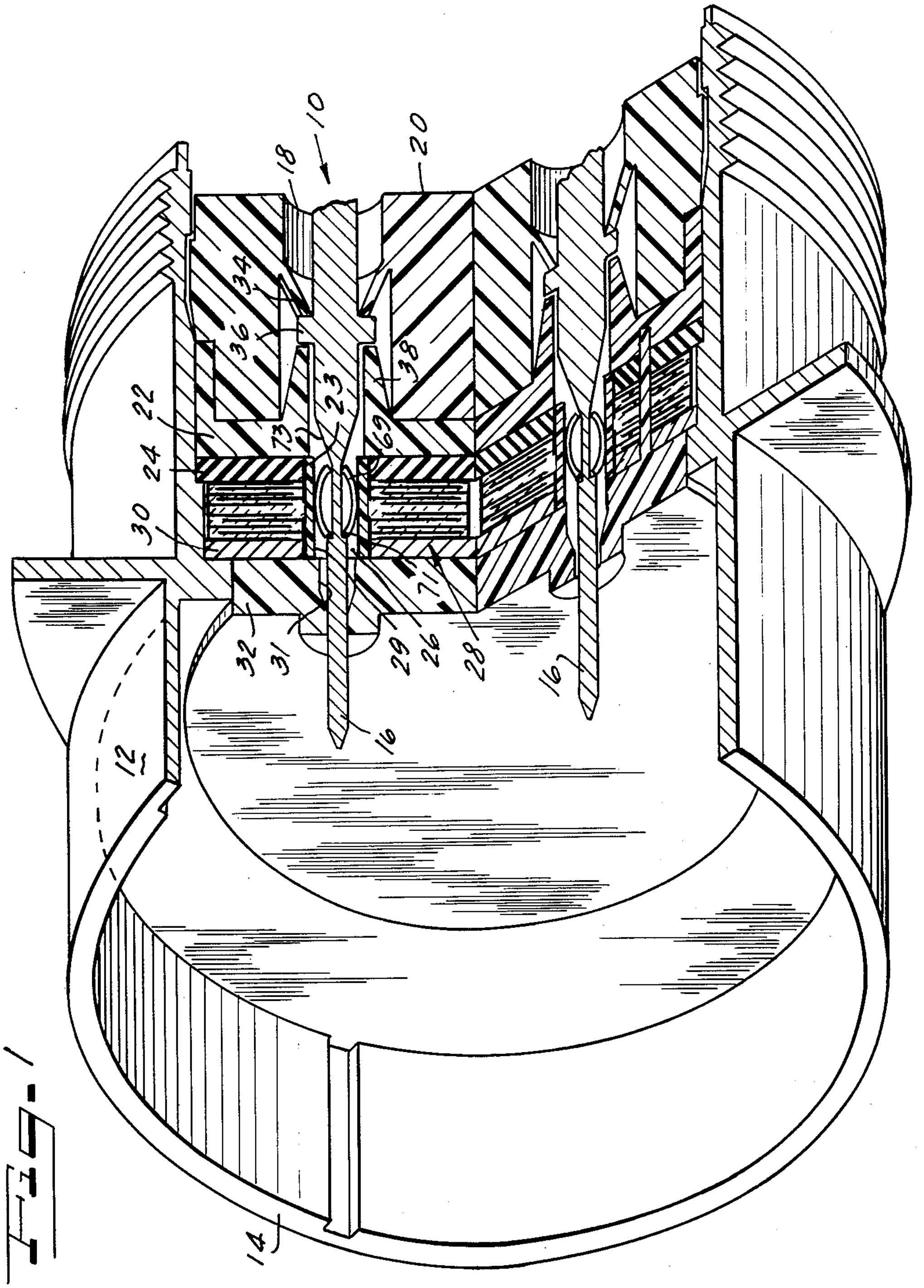
FIG. 1 is an enlarged is isometric view, shown partially in section, of an electrical connector assembly constructed in accordance with the invention.

Referring to FIG. 1, a pin contact connector assembly is illustrated and generally referenced 10. The connector assembly 10 comprises a generally annular metal shell 12 having a front end 14 for telescoping engagement with the shell of a mating connector (not shown) to electrically connect pin contacts, such as 16, in the shell 12 with the receptacle contacts of the mating connector under a desired axial pressure.

The pin contacts 16 are each received in a respective contact receiving passageway 18 of a rear dielectric retention insert 20 which is secured in the shell 12. Each contact passes through a respective aligned passageway 21 in a dielectric disc 22, an aligned passageway 23 in a silicone rubber cushion or disc 24 and then extends through a respective aligned passageway 26 in a filter assembly 28. The pin contact 16 further extends through an aligned passageway 29 in a conductive elastomer or disc 30 and projects through an aligned passageway 31 in a front dielectric insert 32 which is secured in the shell 12 to enable the engagement of the pin contact with the receptacle contact of a mating connector.

The dielectric retention insert 20 is provided with conventional retention tines 34 which extend into each passageway 18 for engagement behind the rear radial face of an enlarged diameter portion or shoulder 36 on the contact 16 to prevent retraction unless the fingers 34 are spread by a suitable tool. The front radial face of the shoulder 36 engages the rear face or projection 38 of the dielectric disc 22 to limit forward movement of the contact 16. A conductor (not shown) is secured to the rear end of each contact to provide an electrical connection therewith, and a conventional grommet (also not shown) is secured to the shell 12 to protect the connection.

As best illustrated in FIG. 2, the filter assembly 28, more specifically a pi filter assembly, is illustrated as comprising a plurality of ceramic discs 40 of a suitably high dielectric constant which are bonded together to form an integral structure. An intermediate ceramic disc 46 is provided in the integral structure as an element which aids in defining two separate capacitors, as will become apparent from the description below. The integral structure includes a plurality of radially extending metal capacitor plates 42 and 44 in alternate axially spaced positions, the plates 44 constituting the ground electrodes and the plates 42 constituting the positive electrodes. All of the ground electrodes 44 are connected in common by a peripheral metal layer 48. The metal layer 48 may contact the metal shell 12; however, a more positive grounding contact occurs through the engagement of the forwardmost plate 44 with the rearward radial face of the conductive elastomer disc 30.

The forward positive capacitor plates 42 have been more specifically referenced 42*a*, while the remaining, rearward, positive plates have been referenced more specifically as 42*b*. The filter structure is provided with a metal layer 50 which is electrically connected to the electrodes 42*a*, and with a metal layer 52 which is electrically connected to the electrodes 42*b*. The metal layers 50 and 52 therefore define separate terminals for separate capacitors, while the metal layer 48 defines a common terminal for both capacitors.

The capacitor structure receives a ferrite tube 56 therein, the ferrite tube carrying a metal layer having a portion 58 which extends over the inner surface of the tube, portions 60 and 62 which extend over the ends of the ferrite tube, and portions 64 and 66 which extend over spaced areas of the outer surface of the ferrite tube. The metal layer portion 66 is electrically connected, such as by fusing, to the metal layer 50, while the layer portion 64 is electrically connected to the metal layer 52. A gap 54 defines a separation between the two capacitors on the outer surface of the ferrite tube 56.

Advantageously, the above structure requires only a single electrical connection to the pin contact 16. In FIG. 2, this single contact is provided by way of a spring contact 68 which is received in a reduced diameter portion of the pin contact 16 so as to abut a forward shoulder 70 and a rear shoulder 72. A similar structure is illustrated in FIG. 1 where a spring contact 69 is provided on a reduced diameter portion of the pin contact 16 to abut a forward shoulder 71 and bear against an outwardly tapering portion 73.

Referring to FIG. 3, a schematic cross sectional representation of a typical three layer pi filter is illustrated for two pin contact holes. The three layers of ceramic dielectric material 74 carry ground electrodes 76 which are interconnected by a metal layer 78, and a pair of positive electrodes 80 which are electrically connected to a metal layer 82 carried on the inner, outer and end surfaces of a ferrite tube 84. The lower-illustrated filter structure includes positive electrodes 86 which are smaller in area than the electrodes 80. Therefore, it is apparent that the positive electrodes may differ in area for each pin contact, which accordingly varies capacitances and filtering characteristics for each pin contact. With this structure, a variety of predetermined filtering values may be provided within the multi-filter structure without an increase in manufacturing costs.

FIGS. 4 and 5 illustrate typical patterns for the ground and pin electrodes, respectively. The electrical interconnections of the ground electrodes have not been illustrated in that a variety of connections may be utilized. It is, however, of interest that a metal layer 88 is provided on a substrate of ceramic material of suitable dielectric constant. The patter is provided such that holes 92 for receiving the metalized ferrite tubes are electrically isolated from the ground electrode 88 by way of gaps 90. In FIG. 5 the difference in area of the positive electrodes is illustrated. A positive electrode 94 is carried on a dielectric substrate and includes a hole 96 therethrough for receiving a metalized ferrite tube. An adjacent similar electrode 98 is similarly constructed and has a smaller capacitive plate area. Likewise, a positive electrode 100 is illustrated as having a still smaller area. Therefore, the pin contacts associated with the capacitors which comprise the plates 94, 98 and 100 will be provided with correspondingly different filter characteristics.

Figure 6:
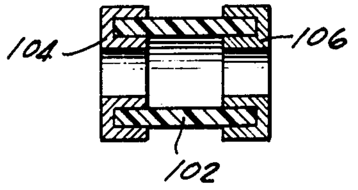
FIGS. 6–9 schematically illustrate, in sectional elevation, a pi filter of the present invention having a non-removable pin contact and the method of fabricating the pi filter.
Figure 7:
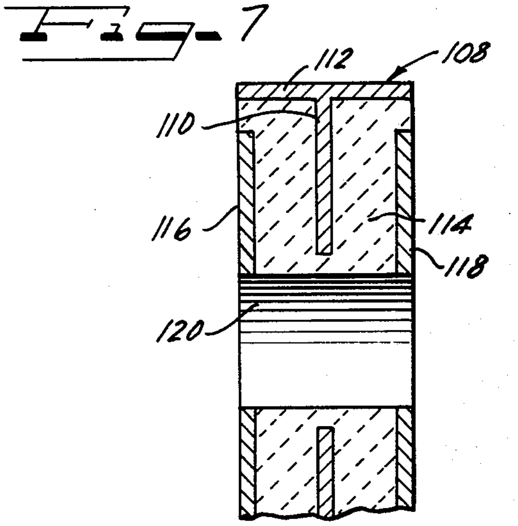

In the foregoing, a pi filter for a pin contact which is removable in the field has been disclosed. It is possible, and advantageous in certain applications, that the pin contacts not be removable. Such a structure and its method of fabrication is illustrated in FIGS. 6–9. FIG. 6 illustrates a tubular ferrite tube 102 which has been metalized over each end and over portions of the inner and outer surfaces adjacent each end as indicated at 104 and 106. FIG. 7 illustrates a two layer structure 108 having a ground electrode 110 with a peripheral metal layer 112 for connection to the metal shell of the connector assembly. The ground electrode 110 and a pair of positive electrodes 116 and 118 are carried by dielectric material 114, the elements being formed into a unitary structure in substantially the same manner discussed above with respect to FIGS. 1 and 2. It should be noted, however, that the electrode 116 extends as far forward as the metal layer 112 and that, therefore, the electrode 116 must be insulated from the connector shell if contact is to be made in a manner similar to that illustrated in FIGS. 1 and 2. An insulating disc inset into the elastomer disc 30 may be used. Also, the layer 112 may extend about the forward face of the structure, insulated from the electrode 116, for better electrical contact with the elastomer disc 30.

Figure 8:
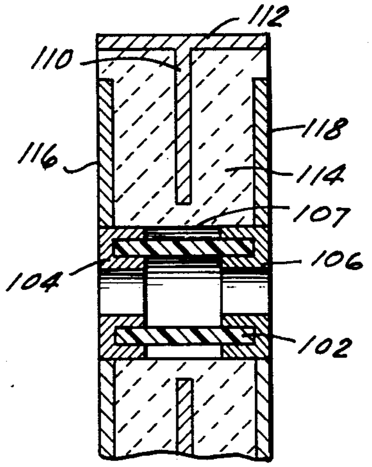
Figure 9:
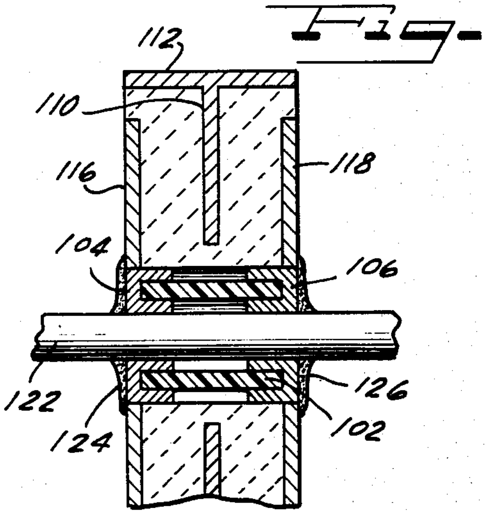

The dielectric material 114 in FIG. 7 includes a bore 120 for receiving the metalized ferrite tube illustrated in FIG. 6. The assembled structure is illustrated in FIG. 8. It will be appreciated that in this partially assembled state the positive electrodes 116 and 118 contact the respective metalizations 104 and 106 carried by the ferrite tube 102. Here again, a gap 107 electrically isolates the capacitors formed by the electrodes 116 and 118 with the electrode 110. Next, a pin contact 122 is inserted a desired distance through the ferrite tube and contacts portions of the metalizations 104 and 106 at the ends and interior surface of the tube. In a final fabrication step, the pin contact 122 is solder bonded or fused to the metalizations 104 and 106 and to the positive electrodes 116 and 118 in a single heating operation, the bond being illustrated at 124 and 126.

Figure 10:
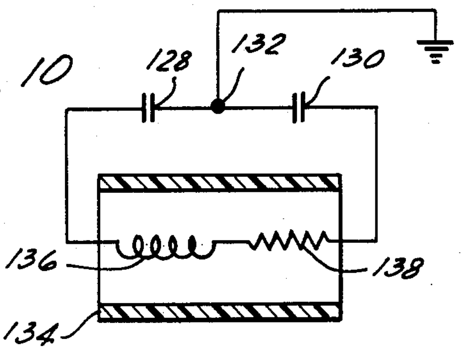
FIG. 10 is an electrical schematic circuit diagram of a pi filter attained by practicing the present invention.

FIG. 10 scematically illustrates an equivalent circuit of a pi filter constructed in accordance with the present invention in which a pair of capacitors 128 and 130 have terminals commonly connected at 132 to ground. The other terminals of the capacitors 128 and 130 are connected in series with an inductance 136 and a resistance 138 constituted by a tubular ferrite member 134.

Conventional techniques have been utilized in providing the structures discussed above. For example the ferrite tube is metalized by emersion in a graphite solution to obtain surface conductivity. The appropriate parts are then electroplated with, for example, a tin-lead alloy (a barrel process). A ring of resist is applied to the outer surface to provide the insulation gap required for separation of the capacitors.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An electrical connector assembly comprising:
- a metal connector shell;
- a dielectric member carried in said shell, said dielectric member including at least one contact passageway extending therethrough;
- an electrical contact mounted in said passageway;
- a hollow tubular inductance member having a inner surface and an outer surface, said electrical contact extending through said member, an inner electrical contact area on said inner surface electrically connected to said electrical contact, and at least one outer contact area on said outer surface electrically connected to said inner electrical contact area;
- a plurality of first planar capacitor plates spaced apart and electrically connected to said outer contact area; and
- a plurality of second capacitor plates extending between and spaced from said first capacitor plates, said second plates electrically connected to said metal connector shell, said capacitor plates and said inductance member constituting a filter.

2. The electrical connector assembly of claim 1, wherein said outer surface of said tubular inductance member includes a pair of spaced outer contact areas each electrically connected to separate groups of said first capacitor plates to form a pi filter.

3. The electrical connector assembly of claim 1, wherein said inductance member comprises an elongate tubular member of ferrite material.

4. An electrical connector assembly comprising:
- a metal connector shell;
- a dielectric member carried in said shell and including at least one contact passageway extending therethrough;
- an electrical contact extending through and mounted in said passageway;
- an inductance within said shell surrounding and electrically connected to said electrical contact; and
- a pair of planar capacitances each including radially extending plates surrounding said inductance, each said capacitance electrically connected between a respective end of said inductance and said shell to form a pi filter.

5. An electrical connector assembly comprising:
- a metal connector shell;
- a dielectric mounted in said shell and including at least one passageway extending axially therethrough;
- an electrical contact mounted in said passageway;
- an inductance within said housing, said inductance comprising a tubular ferrite member including an inner surface and an outer surface, and a metallic layer carried on said inner surface and extending over the ends of said member and over spaced areas of said outer surface, said electrical contact extending through said tubular ferrite member and electrically connected to said metallic layer; and
- a pair of capacitors forming a pi filter with said inductance, each of said capacitors comprising a plurality of radially extending spaced first plates electrically connected to said metallic layer over a respective spaced area of said outer surface of said ferrite member, and a plurality of radially extending second plates spaced from respective ones of said first plates and electrically connected to said shell.

6. The electrical connector assembly of claim 5, comprising a spring contact element carried on said electrical contact to engage the metallic layer and provide an electrical connection therebetween.

7. The electrical connector assembly of claim 5, comprising a solder connection between said electrical contact and said metallic layer.

8. An electrical connector assembly comprising:
- a metallic connector shell;

a dielectric insert mounted in said shell and including at least one contact passageway extending axially therethrough;

an elongate electrical contact mounted in and extending through said contact passageway;

a ferrite tube about a portion of said elongate electrical contact, said tube having spaced ends, an inner surface and an outer surface;

a metallic layer carried on said ferrite tube and extending between spaced areas of said outer surface via said ends and said inner surface, said metallic layer electrically connected to said elongate electrical contact; and a pair of capacitors, each of said capacitors comprising a plurality of radially extending capacitor plates, dielectric material between said capacitor plates, and an annular metallic layer carried on the dielectric material about said ferrite tube and electrically connecting some of said capacitor plates to said metallic layer over a respective one of said spaced areas, and a common annular metallic layer carried by said dielectric material of each of said capacitors and electrically connecting others of said capacitor plates to said metal connector shell.

9. The electrical connector assembly of claim 8, comprising:

a resilient spring contact element carried on said electrical contact and engaging said metallic layer on said inner surface of said ferrite tube.

10. The electrical connector assembly of claim 8, comprising:

an electrical bond connecting said metallic layer and said electrical contact.

11. In an electrical connector assembly of the type wherein an elongate electrical contact is mounted in a contact passageway of a dielectric insert which is carried in a hollow metal connector shell and at least one planar type capacitor having radially extending plates is mounted in the shell and electrically connected as a filter element between the electrical contact and the shell, the improvement therein comprising:

a tubular ferrite member disposed about the electrical contact and electrically connected to the contact and the capacitor.

12. In an electrical connector assembly of the type wherein an elongate electrical contact is mounted in a contact passageway of a dielectric insert which is carried in a hollow metal connector shell and a pair of planar type capacitors having radially extending plates are mounted in the shell and electrically connected as a filter between the electrical contact and the shell, the improvement therein comprising:

a tubular ferrite member disposed about the electrical contact; and a metallic layer carried on said ferrite member and contacting the pair of capacitors and the electrical contact at spaced points to form a pi filter.

13. An electrical connector assembly comprising:

a metallic connector shell;

a dielectric mounted in said shell and having a longitudinal axis, said dielectric insert including a plurality of passageways therethrough extending spaced apart parallel to said longitudinal axis;

a plurality of elongate electrical contacts, each of said electrical contacts including an active portion at one end for engaging a complementary contact of a mating electrical connector, a conductor-receiving portion at the other end for connection to an electrical conductor and a portion intermediate said active and conductor-receiving portions, said intermediate portion mounted in a respective passageway of said dielectric insert;

a plurality of ferrite tubes each surrounding a respective electrical contact and including spaced ends, an inner surface, and an outer surface, and at least one metallic layer carried by said tube and extending over spaced areas of said outer surface, over said ends and over at lleast spaced areas of said inner surface, said metallic layer on the inner surface electrically connected to the respective electrical contact;

a plurality of pairs of capacitors, each of capacitors associated with a respective ferrite tube, each capacitor of a pair of capacitors comprising a plurality of planar, radially extending, spaced capacitor plates, first ones of said capacitor plates electrically connected to said metal connector shell and second ones of said capacitor plates electrically connected to said metallic layer over a respective one of said spaced areas, each pair of capacitors and the associated ferrite tube constituting a pi filter for the electrical contact which extends through that ferrite tube.

14. An electrical connector assembly, comprising:

a metal connector shell;

a dielectric insert mounted in said shell and having a longitudinal axis, said dielectric insert including a plurality of passageways therethrough spaced apart and extending parallel to said longitudinal axis;

a plurality of elongate electrical contacts, each of said contacts including an active portion at one end for engaging a complementary contact of a mating electrical connector, a conductor-receiving portion at the other end for connection to an electrical conductor, and a portion intermediate said active and conductor-receiving portions, said intermediate portion mounted in a respective passageway of said dielectric insert;

a plurality of ferrite tubes each circumscribing a respective contact and including spaced ends, an inner surface and an outer surface, and at least one metallic layer carried by said tube and extending over spaced areas of said outer surface, over said ends and over at least spaced areas of said inner surface, said metallic layer electrically connected to the respective electrical contact; and a plurality of pairs of capacitors, each pair of capacitors associated with a respective ferrite tube, each capacitor of a pair of capacitors comprising:

a plurality of dielectric discs, a plurality of radially extending metallic layer capacitor plates carried on respective ones of said discs, first ones of said capacitor plates electrically connected to said metal connector shell and second ones of said capacitor plates electrically connected to said metallic layer of the respective ferrite tube over a respective one of said spaced areas, each pair of capacitors and the associated ferrite tube constituting a pi filter for the electrical contact which extends through that ferrite tube, the metallic layer capacitor plates having differing areas providing differing filter characteristics.

* * * * *